(12) United States Patent
Goss et al.

(10) Patent No.: US 10,254,969 B2
(45) Date of Patent: Apr. 9, 2019

(54) DATA REFRESH IN FLASH MEMORY

(71) Applicant: SEAGATE TECHNOLOGY LLC, Cupertino, CA (US)

(72) Inventors: Ryan J. Goss, Prior Lake, MN (US); Antoine Khoueir, Edina, MN (US); Ara Patapoutian, Hopkinton, MA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 2 days.

(21) Appl. No.: 15/154,786

(22) Filed: May 13, 2016

(65) Prior Publication Data

US 2017/0329532 A1 Nov. 16, 2017

(51) Int. Cl.
*G06F 12/00* (2006.01)
*G06F 3/06* (2006.01)
*G06F 11/10* (2006.01)
*G11C 29/52* (2006.01)

(52) U.S. Cl.
CPC ............ *G06F 3/0611* (2013.01); *G06F 3/064* (2013.01); *G06F 3/0652* (2013.01); *G06F 3/0653* (2013.01); *G06F 3/0688* (2013.01); *G06F 11/1068* (2013.01); *G11C 29/52* (2013.01); *G06F 2212/1016* (2013.01); *G06F 2212/2022* (2013.01); *G06F 2212/7205* (2013.01)

(58) Field of Classification Search
None
See application file for complete search history.

(56) References Cited

U.S. PATENT DOCUMENTS

| | | | |
|---|---|---|---|
| 7,426,611 B1 * | 9/2008 | Gupta | G06F 12/0897 711/113 |
| 8,898,373 B1 | 11/2014 | Kang et al. | |
| 2011/0231623 A1 * | 9/2011 | Goss | G06F 12/0253 711/159 |
| 2011/0231732 A1 * | 9/2011 | Chu | G06F 11/1048 714/763 |
| 2013/0339643 A1 * | 12/2013 | Tekade | G06F 17/30581 711/162 |
| 2015/0019797 A1 | 1/2015 | Huang et al. | |
| 2015/0026391 A1 | 1/2015 | Su et al. | |

* cited by examiner

*Primary Examiner* — Baboucarr Faal
*Assistant Examiner* — Brett P Lohmeier
(74) *Attorney, Agent, or Firm* — Holland & Hart LLP

(57) ABSTRACT

Systems and methods for improving data refresh in flash memory are described. In one embodiment, the method includes identifying a first garbage collection unit (GCU) of the storage system, computing a parity function in relation to the first GCU, identifying a data impairment in a first block, the first block being from the N blocks in the first GCU, removing the first block from the first GCU after identifying the data impairment in the first block, and recomputing the parity function when the first block is not cloned.

20 Claims, 9 Drawing Sheets

DATA REFRESH IN FLASH MEMORY

SUMMARY

The present disclosure is directed to methods and systems for improving data refresh in flash memory. In some embodiments, the present systems and methods may refresh data in blocks of a garbage collection unit (GCU) at a sub-GCU or block-by-block granularity.

A storage device for improving data refresh in flash memory is described. In one embodiment, the storage device may include a storage controller performing the steps of identifying a first garbage collection unit (GCU) of the storage system, computing a parity function in relation to the first GCU, identifying a data impairment in a first block, the first block being from the N blocks in the first GCU, removing the first block from the first GCU after identifying the data impairment in the first block, and recomputing the parity function when the first block is not cloned. In some cases, the first GCU may include N blocks from the multiple blocks.

In some embodiments, the storage controller may determine whether the first block includes stale data and clone the first block into a second block upon determining the first block does not include stale data. In some cases, the storage controller may clone the first block into the second block even if the first block includes stale data. In some cases, the first block may be cloned into the second block based on a ratio of stale data to valid data in the first block.

In some cases, the second block may be an available block from the multiple blocks in a storage drive and separate from the N blocks in the first GCU. In some embodiments, the storage controller may add the second block to the first GCU.

After adding the second block to the first GCU, the storage controller may maintain the parity of the first GCU as is based on the second block being a clone of the first block. For example, parity for the first GCU may be computed and then left as originally computed after adding the second block to the first GCU since the second block is a clone of the first block that is removed from the first GCU. In some cases, the parity of the first GCU may be based on an XOR parity.

In some embodiments, the storage controller may erase the first block and make the first block available to another GCU. In some cases, the storage controller may determine a ratio of stale data to valid data in the first block upon determining the first block includes stale data. Based on the ratio of stale data to valid data in the first block, the storage controller may remove the first block from the first GCU without cloning the first block. In some cases, the storage controller may copy the valid data in the first block to a third block, the third block being a block from a second GCU with M blocks from the multiple blocks.

In one embodiment, the storage controller may recompute the parity function of the first GCU based on there being N-1 blocks remaining in the first GCU after removing the first block from the first GCU without cloning the first block.

An apparatus for improving data refresh in flash memory is also described. In one embodiment, the apparatus may include a processor, memory in electronic communication with the processor, and instructions stored in the memory, the instructions being executable by the processor to perform the steps of identifying a first garbage collection unit (GCU) of the storage system, computing a parity function in relation to the first GCU, identifying a data impairment in a first block, the first block being from the N blocks in the first GCU, removing the first block from the first GCU after identifying the data impairment in the first block, and recomputing the parity function when the first block is not cloned. In some cases, the first GCU may include N blocks from the multiple blocks.

A method for improving data refresh in flash memory is also described. In one embodiment, the method may include identifying a first garbage collection unit (GCU) of the storage system, computing a parity function in relation to the first GCU, identifying a data impairment in a first block, the first block being from the N blocks in the first GCU, removing the first block from the first GCU after identifying the data impairment in the first block, and recomputing the parity function when the first block is not cloned. In some cases, the first GCU may include N blocks from the multiple blocks.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein—including their organization and method of operation—together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components—including those having a dash and a second reference label—apply to other similar components. If only the first reference label is used in the specification, the description is applicable to any one of the similar components having the same first reference label irrespective of the second reference label.

DETAILED DESCRIPTION

The following relates generally to improving data refresh in flash memory. A solid state drive may exhibit performance variability over the life of the drive due to various activities that manage media stored on the drive. Relocation of data may be scheduled at certain times and/or circumstances to mitigate read-disturb by invoking data refresh such as garbage collection (GC). However, data relocation may cause variability in performance. In the presence of some impairment such as high error rate due to, for example, read disturb, variability in performance may be minimized by refreshing blocks in a garbage collection unit (GCU) individually.

Currently, if a single block is marked to be refreshed, every block in the GCU is refreshed, which is inefficient and increases the drive performance variability. In one embodiment, only the block of interest is refreshed by cloning the block with impairment into another block. The rest of the blocks in the GCU remain as is, and thus, the content within the GCU remains unchanged. In some embodiments, the block with impairment may be removed from the GCU. The parity (or the parities) of the outer code may be modified so that the outer code is no longer a function of the block being removed. Valid data in the block being removed may be copied to another block in a different GCU and any stale data in the block is not copied to this other block from the different GCU.

Figure 1:
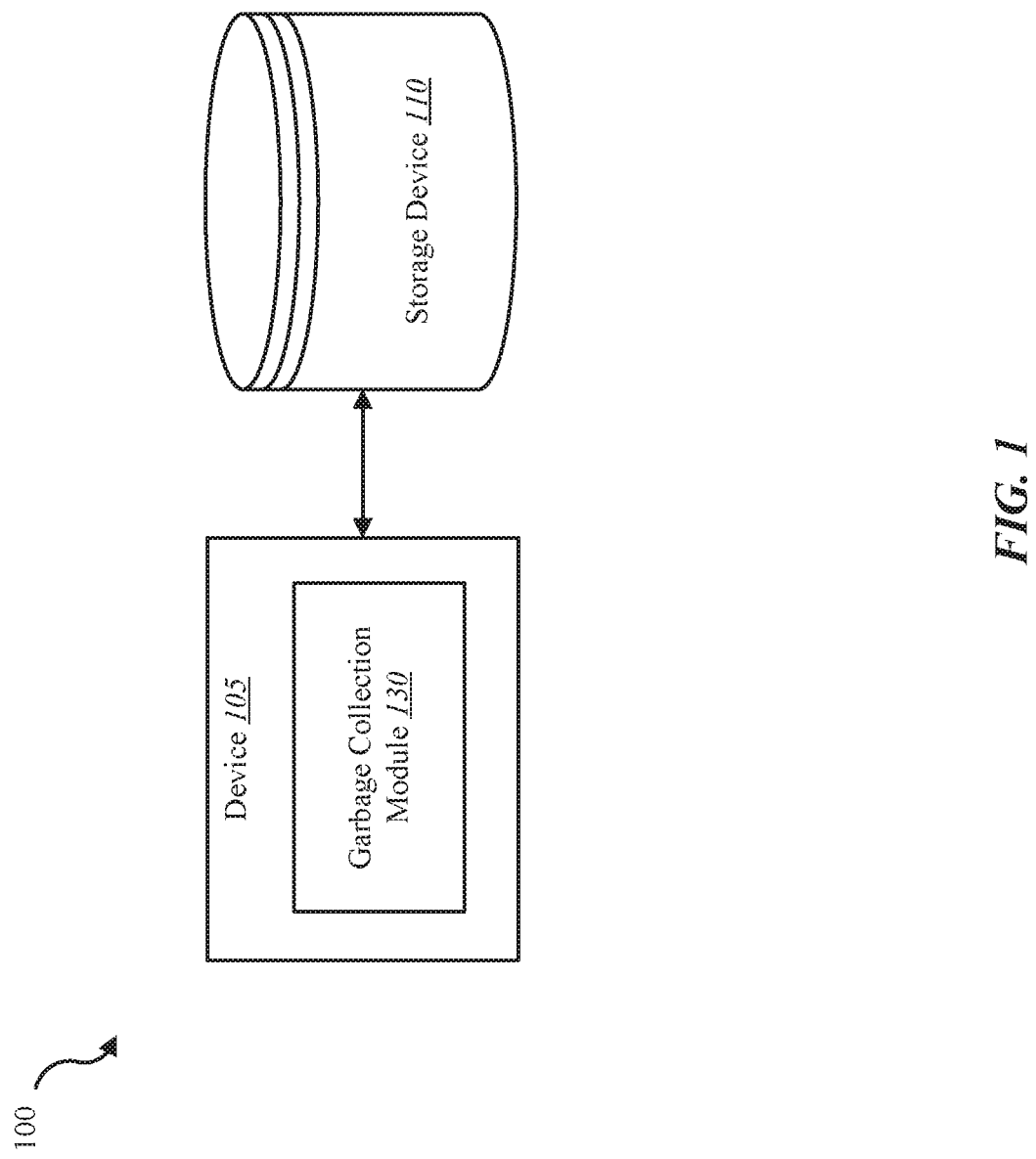
FIG. 1 is a block diagram of an example of a system in accordance with various embodiments.

FIG. 1 is a block diagram illustrating one embodiment of an environment 100 in which the present systems and methods may be implemented. The environment may include device 105 and storage device 110. The storage device 110 may include any combination of hard disk drives, solid state drives, and hybrid drives that include both hard disk and solid state drives. In some embodiments, the systems and methods described herein may be performed on a single device (e.g., device 105). In some cases, the methods described herein may be performed on multiple storage devices or a network of storage devices. Examples of device 105 include a storage server, a storage enclosure, a storage controller, storage drives in a distributed storage system, storage drives on a cloud storage system, storage devices on personal computing devices, storage devices on a server, etc. In some configurations, device 105 may include a garbage collection module 130. In one example, the device 105 may be coupled to storage device 110. In some embodiments, device 105 and storage device 110 may be components of flash memory or a solid state drive. Alternatively, device 105 may be a component of a host (e.g., operating system, host hardware system, etc.) of the storage device 110.

In one embodiment, device 105 may be a computing device with one or more processors, memory, and/or one or more storage devices. In some cases, device 105 may include a wireless storage device. In some embodiments, device 105 may include a cloud drive for a home or office setting. In one embodiment, device 105 may include a network device such as a switch, router, access point, etc. In one example, device 105 may be operable to receive data streams, store and/or process data, and/or transmit data from, to, or in conjunction with one or more local and/or remote computing devices.

The device 105 may include a database. In some cases, the database may be internal to device 105. For example, storage device 110 may include a database. Additionally, or alternatively, the database may include a connection to a wired and/or a wireless database. Additionally, as described in further detail herein, software and/or firmware (e.g., stored in memory) may be executed on a processor of device 105. Such software and/or firmware executed on the processor may be operable to cause the device 105 to monitor, process, summarize, present, and/or send a signal associated with the operations described herein.

In some embodiments, storage device 110 may connect to device 105 via one or more networks. Examples of networks include cloud networks, local area networks (LAN), wide area networks (WAN), virtual private networks (VPN), a personal area network, near-field communication (NFC), a telecommunications network, wireless networks (using 802.11, for example), and/or cellular networks (using 3G and/or LTE, for example), etc. In some configurations, the network may include the Internet and/or an intranet. The device 105 may receive and/or send signals over a network via a wireless communication link. In some embodiments, a user may access the functions of device 105 via a local computing device, remote computing device, and/or network device. For example, in some embodiments, device 105 may include an application that interfaces with a user. In some cases, device 105 may include an application that interfaces with one or more functions of a network device, remote computing device, and/or local computing device.

In one embodiment, the storage device 110 may be internal to device 105. As one example, device 105 may include a storage controller that interfaces with storage media of storage device 110. Garbage collection module 130 may be configured to isolate an impairment such as read disturb or high error rate in relation to a single block of a GCU. Garbage collection module 130 may refresh data on that single block of the GCU and bypass refreshing data on the other blocks of the GCU.

Figure 2:
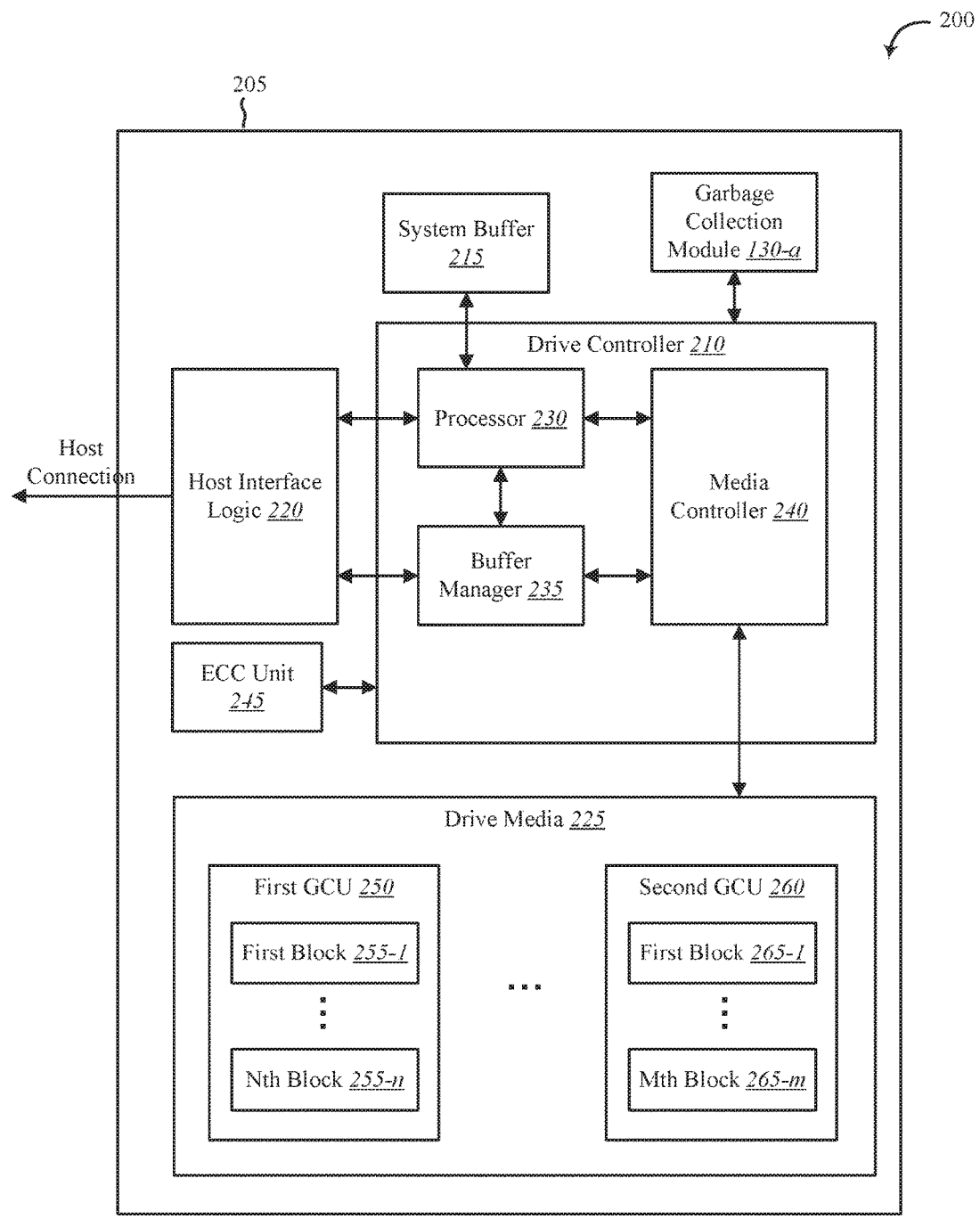
FIG. 2 shows a block diagram of a device in accordance with various aspects of this disclosure.

FIG. 2 shows a block diagram 200 of an apparatus 205 for use in electronic communication, in accordance with various aspects of this disclosure. The apparatus 205 may be an example of one or more aspects of device 105 described with reference to FIG. 1. The apparatus 205 may include a drive controller 210, drive buffer 215, host interface logic 220, drive media 225, and garbage collection module 130-a. Each of these components may be in communication with each other and/or other components directly and/or indirectly.

One or more of the components of the apparatus 205, individually or collectively, may be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each module may also be implemented—in whole or in part—with instructions embodied in memory formatted to be executed by one or more general and/or application-specific processors.

In one embodiment, the drive controller 210 may include a processor 230, a buffer manager 235, and a media controller 240. The drive controller 210 may process, via processor 230, read and write requests in conjunction with the host interface logic 220, the interface between the apparatus 205 and the host of apparatus 205 (e.g., an operating system, host hardware system, etc.). The drive buffer 215 may hold data temporarily for internal operations of apparatus 205. For example, a host may send data to apparatus 205 with a request to store the data on the drive media 225. The driver controller 210 may process the request and store the received data in the drive media 225. In some cases, a portion of data stored in the drive media 225 may be copied to the drive buffer 215 and the processor 230 may process or modify this copy of data and/or perform an operation in relation to this copy of data held temporarily in the drive buffer 215.

Although depicted outside of drive controller 210, in some embodiments, garbage collection module 130-a may include software, firmware, and/or hardware located within drive controller 210 and/or other components of apparatus 205. For example, garbage collection module 130-a may include at least a portions of processor 230, buffer manager 235, and/or media controller 240. In one example, garbage collection module 130-a may include one or more instructions executed by processor 230, buffer manager 235, and/or media controller 240.

As depicted, drive media 225 may include two or more GCUs such as first GCU 250 and second GCU 260. As shown, each GCU may include multiple blocks such as first block 255-1 to Nth block 255-n in first GCU 250 and first block 265-1 to Mth block 265-m in second GCU 260. Each block may include several pages, each page including multiple memory cells. In some embodiments, a GCU may be a logical collection of blocks from one or more dies of a storage drive. Thus, although a GCU may include a contiguous selection of dies all from the same block, in some embodiments, the blocks of a GCU may include blocks in any order. For example, a GCU with six blocks may include block 1, block 20, block 31, block 55, and block 78 from a single die. In some cases, a GCU may include blocks from two or more dies. Thus, a GCU may include block 3 from a first die, block 27 from a second die, and so forth.

In some embodiments, garbage collection module 130 may perform one or more functions in conjunction with a storage controller and/or multiple memory cells divided into multiple blocks in a storage drive. For example, a storage drive may include several memory cells divided into multiple pages, the pages divided into multiple blocks, and the blocks divided into several garbage collection units (GCUs). As one example, a page may include 65,536 memory cells, a block may include 256 pages for a total of 16,777,216 memory cells per block, and a GCU may include 64 blocks give or take one or more blocks. As explained below, the number of blocks in a GCU may vary for each GCU. For example, if a GCU were configured to include 64 blocks by default, one GCU may include 64 blocks, another GCU 63 blocks, another GCU 60 blocks, another GCU 70 blocks, and so forth.

In one embodiment, parity (or parities) may be computed for the blocks of first GCU 250 and/or the blocks of second GCU 260. In some embodiments, one or more blocks of first GCU 250 and/or second GCU 260 may be configured as parity blocks. In some cases, the garbage collection module 130-a may be configured to refresh a single block in first GCU 250 and/or second GCU 260. For example, in some embodiments, garbage collection module 130-a may identify an impairment in relation to first block 255-1. Accordingly, garbage collection module 130-a may copy content from first block 255-1 to another block outside of first GCU 250. In some cases, garbage collection module 130-a may clone the contents of first block 255-1 to another block, creating a complete copy of first block 255-1 in the other block. In this case, garbage collection module 130-a may remove first block 255-1 from first GCU 250 and replace first block 255-1 with the other block that is a copy of first block 255-1. Accordingly, garbage collection module 130-a may maintain the parity for first GCU 250 because the data structure of first GCU 250 remains the same as when the parity was computed.

Alternatively, in some embodiments, garbage collection module 130-a may identify stale and valid data in first block 255-1 and copy only the valid data to another block outside first GCU 250. In this case, garbage collection module 130-a may remove first block 255-1 and the other block to which the valid data of first block 255-1 was copied may remain separate from first GCU 250 in another GCU. Because first block 255-1 is not replaced with a clone in this case, garbage collection module 130-a may recompute parity for first GCU 250.

Figure 3:
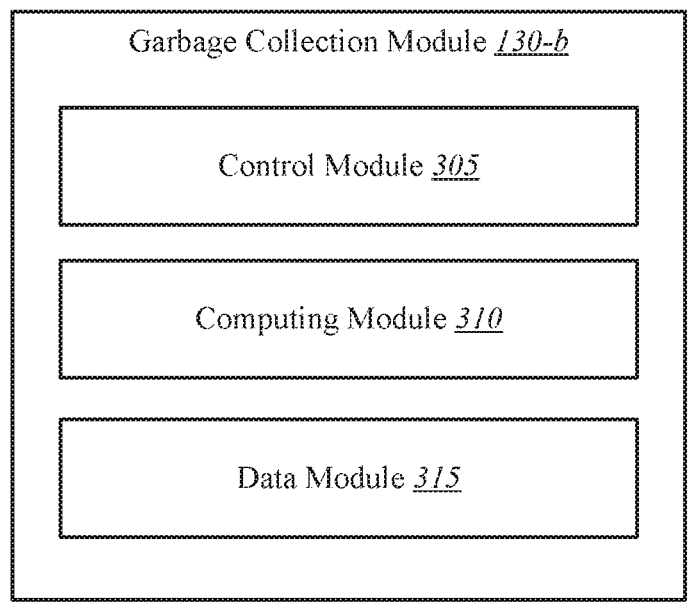
FIG. 3 shows a block diagram of one or more modules in accordance with various aspects of this disclosure.

FIG. 3 shows a block diagram 300 of a garbage collection module 130-b. The garbage collection module 130-b may include one or more processors, memory, and/or one or more storage devices. The garbage collection module 130-b may include control module 305, computing module 310, and data module 315. The garbage collection module 130-b may be one example of garbage collection module 130 of FIGS. 1 and/or 2. Each of these components may be in communication with each other.

In one embodiment, control module 305 may be configured to identify a first GCU of the storage system. In some cases, the first GCU may include N blocks from the multiple blocks in the storage drive. In some embodiments, computing module 310 may be configured to compute a parity function in relation to one or more GCUs. As one example, the computing module 310 may compute a parity function for the first GCU. In some cases, the blocks in the first GCU may be configured as one or more stripes of data blocks. In some embodiments, computing module 310 may compute multiple parity functions in relation to a GCU. In some cases, computing module 310 may compute a parity function with multiple parities per stripe in a given GCU. Thus, the computing module 310 may compute one or more parity blocks based on the blocks in the first GCU. In some cases, the computing module 310 may compute an exclusive OR (XOR) parity function for the first GCU. For example, the computing module 310 may use a bitwise XOR function to compute the parity values from the array data (i.e., the data contained in the blocks of the first GCU). In some embodiments, the computing module 310 may compute the Reed-Solomon parity functions.

In some embodiments, data module 315 may be configured to identify a data impairment in a first block. The first block may be any of the N blocks in the first GCU. Thus, the first block may be the literal first block in the GCU, the last block of the GCU, or any block in between. In some cases, an impairment may be identified based on monitoring performance of the storage drive. In some cases, monitoring may work on a predetermined schedule. In some embodiments, impairment may be based on detecting a high error rate (for example, due to read disturb) in relation to an operation on a block in a GCU.

After identifying the data impairment in the first block, in some embodiments, control module 305 may be configured to remove the first block from the first GCU. In some embodiments, computing module 310 may be configured to recompute the parity function when the first block is not cloned. For example, computing module 310 may compute parity for the first GCU based on N blocks in the first GCU. If the first block is cloned to another block outside the first GCU, the first block removed from the first GCU, and the other block in which the first block was cloned is added to the first GCU, then the originally computed parity remains functionally valid for the first GCU. The first GCU contains the same pattern of data since the other block added to the first GCU is an exact copy of the first block that is removed from the first GCU. In some embodiments, upon removing the first block from the first GCU, data module 315 may be configured to erase data from the first block. In some cases, control module 305 may be configured to make the erased first block available to another GCU.

In some embodiments, data module 315 may be configured to determine whether the first block includes stale data. In some embodiments, data module 315 may be configured to clone the first block into a second block upon determining the first block does not include stale data. Stale data may include data marked as invalid in the storage drive. In some cases, the second block may be an available block from the multiple blocks of the storage drive. In some embodiments, the second block may be separate from the N blocks in the first GCU. In some embodiments, the second block may be a block from a second GCU. In some cases, the blocks in the first GCU may be mutually exclusive from the blocks in the second GCU.

In some embodiments, after the data module 315 clones the first block into the second block, control module 305 may be configured to add the second block to the first GCU. In some embodiments, a logical addressing of the second block may be updated. For example, a mapping of a logical block address (LBA) may be updated. In some cases, control module 305 may update an LBA of the second block to be associated with the first GCU. For example, the LBA of the second block may be associated with a second GCU. Upon the data module 315 cloning the first block into the second block, the control module may update the LBA of the second block to be associated with the first GCU. After adding the second block to the first GCU, in some embodiments, control module 305 may be configured to maintain the parity of the first GCU as computed based on the second block being a clone of the first block. Since the second block is a clone of the first block, the XOR parity remains valid.

In some embodiments, computing module 310 may be configured to determine a ratio of stale data to valid data in the first block upon determining the first block includes stale data. Based on the ratio of stale data to valid data in the first block, in some embodiments, control module 305 may be configured to remove the first block from the first GCU without cloning the first block. For example, control module may be configured to remove the first block from the first GCU when the percentage of stale data in the first block is greater than the percentage of valid data. In some cases, control module may remove the first block based on one or more factors, including the ratio of state data to valid data. For example, control module 305 may be configured to remove the first block based on a comparison of the time to copy the stale data with the valid data to another block compared to the time to copy only the valid data to another block. Control module 305 may determine the time and computational cost to recompute parity based on copying only the valid data and removing the first block from the GCU without replacing the first block with a clone of the first block. In some cases, control module 305 may analyze these times and relative computational cost to determine whether to clone the first block with stale data or copy only the valid data from the first block and remove the first block without a clone.

In some embodiments, data module 315 may be configured to copy the valid data in the first block to a third block. In some cases, the third block may be a block from a third GCU. The third GCU may be a different GCU from the first GCU with M blocks from the multiple blocks in the storage drive. In some cases the number of blocks in the first and third GCUs may differ (e.g., N does not equal M). Alternatively, in some cases both the first and second GCUs may have the same number of blocks (e.g., N equals M). Thus, in some cases, only the valid data from the first block is copied to the third block while copying the stale data in the first block is bypassed.

In some embodiments, removing the first block from the first GCU without replacing the first block with a clone may leave the first GCU with N-1 blocks. Thus, in some cases, computing module 310 may be configured to recompute the parity function of the first GCU based on there being N-1 blocks remaining in the first GCU after removing the first block from the first GCU and not replacing the first block with a clone of the first block. Thus, computing module 310 may be configured to first compute a parity function based on N blocks in the first GCU. After removing one of the blocks from the first GCU and not replacing it with a clone, computing module 310 may be configured to recompute the parity function based on the N-1 blocks remaining in the first GCU.

Figure 4:
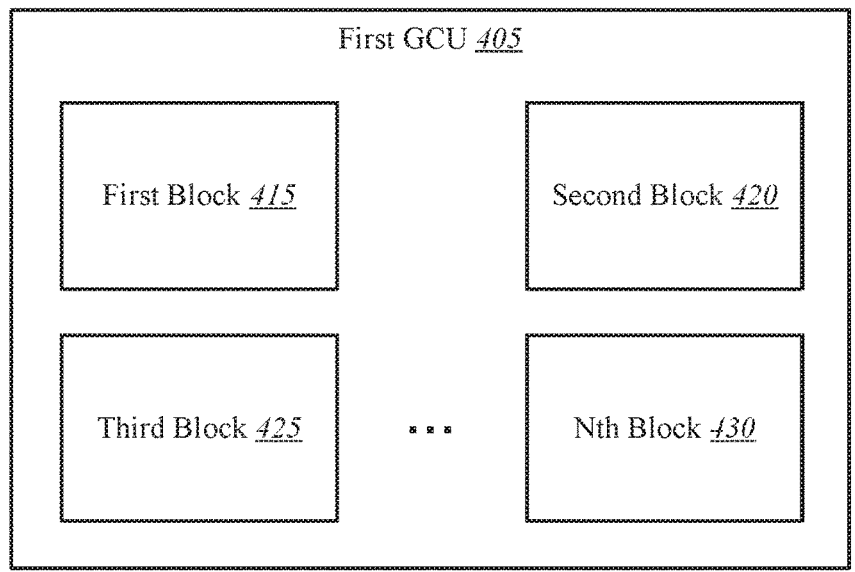
FIG. 4 shows a diagram of one embodiment of an environment in accordance with various aspects of this disclosure.
Figure 4:
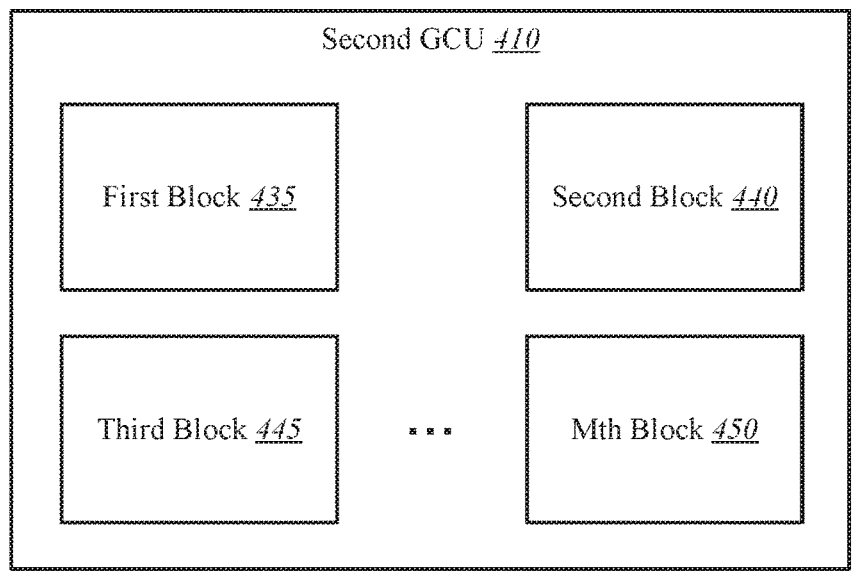
Figure 4:

FIG. 4 shows an environment 400 for improving data refresh in flash memory, in accordance with various examples. Environment 400 may include first GCU 405 and second GCU 410, either of which may be an example of first GCU 250 or second GCU 260 of FIG. 2. At least one aspect of environment 400 may be implemented in conjunction with device 105 of FIG. 1, apparatus 205 of FIG. 2, and/or garbage collection module 130 depicted in FIGS. 1, 2 and/or 3.

As shown, first GCU 405 may include N blocks and second GCU 410 may include M blocks. In some embodiments, N may equal M, resulting in first GCU 405 having the same number of blocks as second GCU 410. Alternatively, first GCU 405 may have more or less blocks as the number of blocks in second GCU 410. In one embodiment, environment 400 depicts two GCUs out of multiple GCUs on a storage drive. In some cases, second GCU 410 may include blocks from the same die as blocks from first GCU 405. Alternatively, second GCU 410 may include blocks from a different die as the blocks from first GCU 405. In some embodiments, first GCU 405 and/or second GCU 410 may include blocks from two or more dies of a storage drive. As described above, in some embodiments, parity may be computed based on the N blocks in first GCU 405 and/or the M blocks in second GCU 410. Accordingly, one or more blocks of first GCU 405 may be configured as parity blocks and/or one or more blocks of second GCU 410 may be configured as parity blocks.

Figure 5:
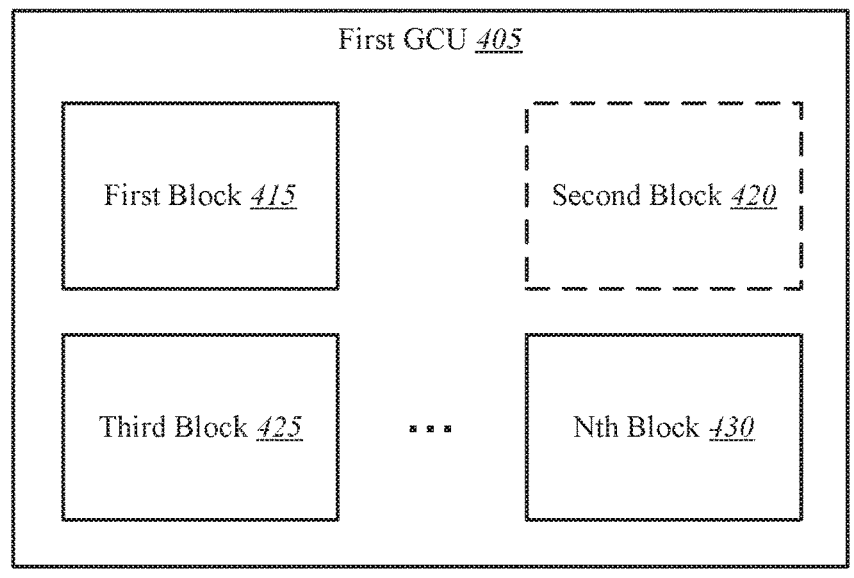
FIG. 5 shows another embodiment of an environment in accordance with various aspects of this disclosure.
Figure 5:
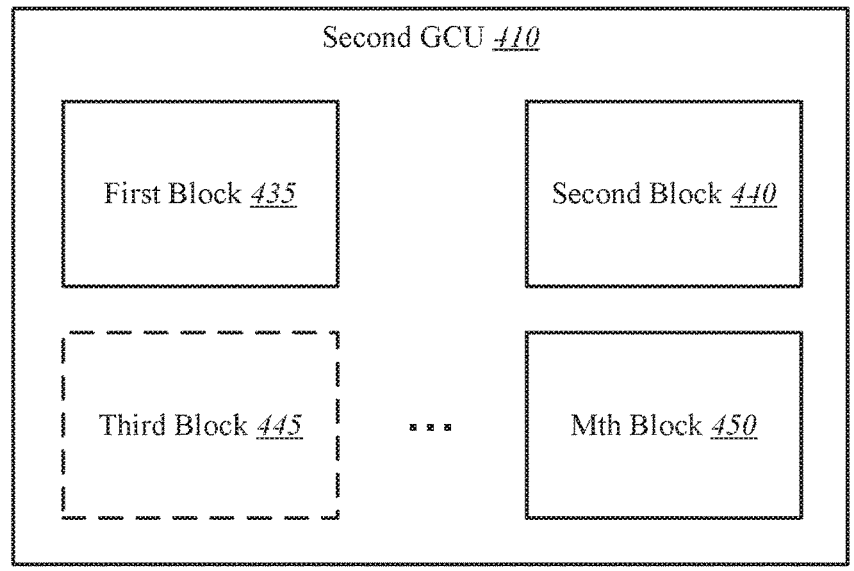

FIG. 5 shows an environment 500 for improving data refresh in flash memory, in accordance with various examples. Environment 500 may be one example of environment 400 of FIG. 4. At least one aspect of environment 500 may be implemented in conjunction with device 105 of FIG. 1, apparatus 205 of FIG. 2, and/or garbage collection module 130 depicted in FIGS. 1, 2 and/or 3.

In one embodiment, an impairment may be identified in relation to second block 420 from first GCU 405. Accordingly, the data in second block 420 may be refreshed and second block 420 may be removed from first GCU 405. In some cases, all of the data from second block 420 may be copied to another block such as third block 445 of second GCU 410. Thus, third block 445 may be a clone of second block 420. Alternatively, only valid data from second block 420 may be copied to another block such as first block 435 of second GCU 410 and the second block 420 may be removed from first GCU 405 and erased to make the block available for another GCU.

Figure 6:
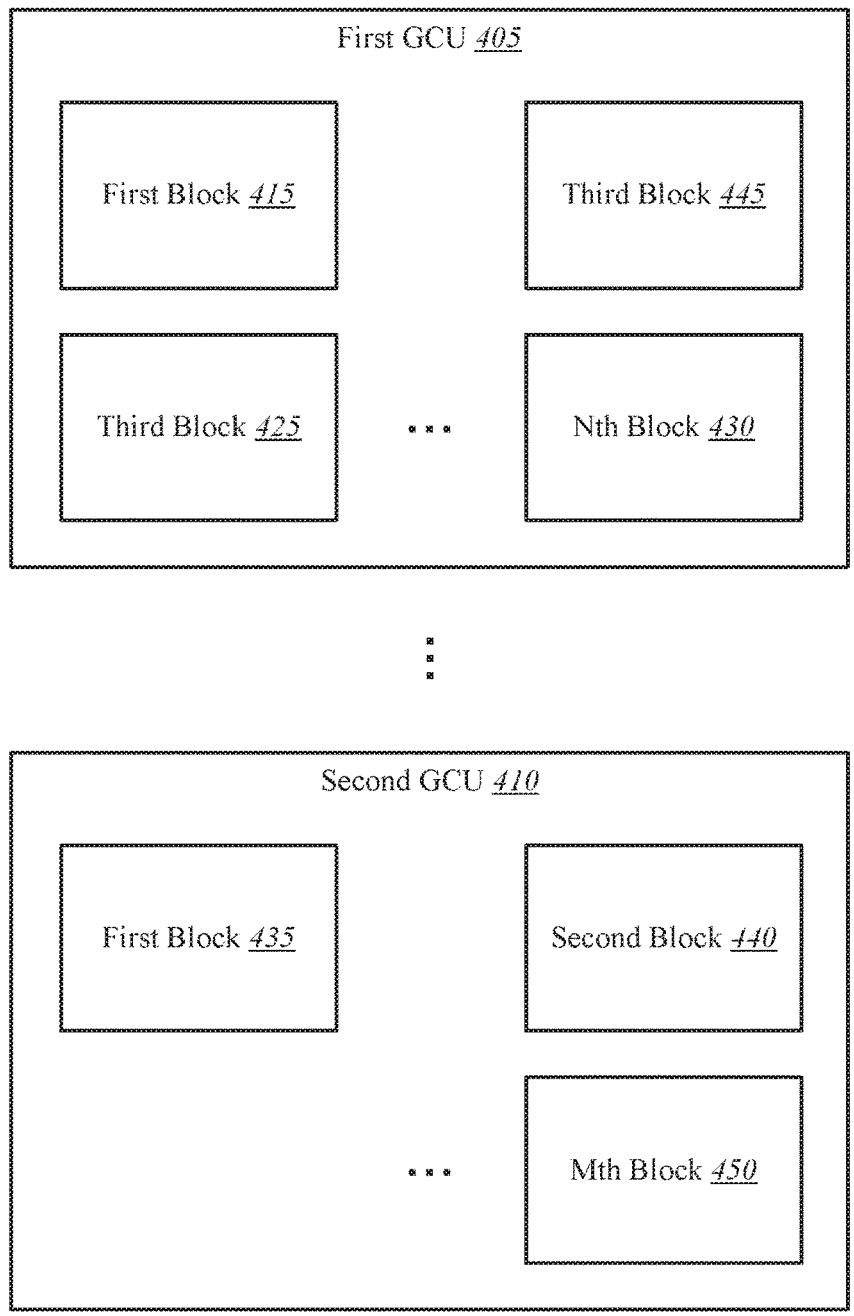
FIG. 6 shows another embodiment of an environment in accordance with various aspects of this disclosure.

FIG. 6 shows an environment 600 for improving data refresh in flash memory, in accordance with various examples. Environment 600 may be one example of environment 400 of FIG. 4 and/or environment 500 of FIG. 5. At least one aspect of environment 600 may be implemented in conjunction with device 105 of FIG. 1, apparatus 205 of FIG. 2, and/or garbage collection module 130 depicted in FIGS. 1, 2 and/or 3.

In one embodiment, second block 420 may be cloned into third block 445, as described above in relation to FIG. 5. In some embodiments, third block 445 may be an exact copy of second block 420 after copying the contents of second block 420 into third block 445. In some embodiments, third block 445 may be added to first GCU 405 from second GCU 410. Accordingly, in some embodiments, the parity function associated with first GCU 405 may be maintained as originally computed since third block 445 is a clone of second block 420.

In some cases, second block 420 may be erased and made available to another GCU. For example, in one embodiment, the erased second block 420 may be included in second GCU 410. Alternatively, the erased second block 420 may be included in another GCU not shown. Upon removing third block 445 from second GCU 410, a parity function associated with second GCU 410 may be recomputed based on third block 445 being removed from second GCU 410 leaving M-1 blocks in second GCU 410 instead of the M blocks that were in second GCU 410 when parity was previously computed.

Figure 7:
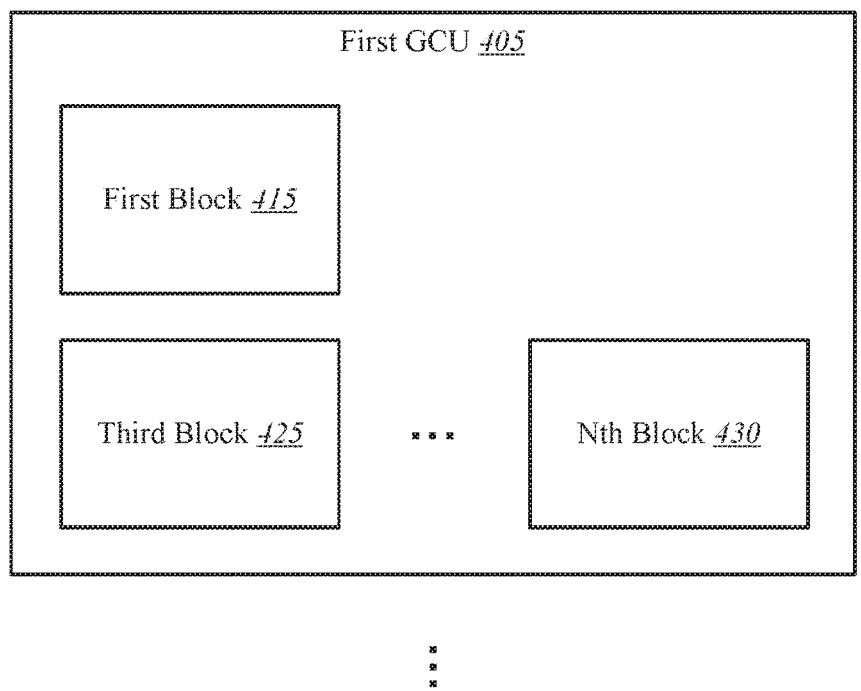
FIG. 7 shows another embodiment of an environment in accordance with various aspects of this disclosure.
Figure 7:
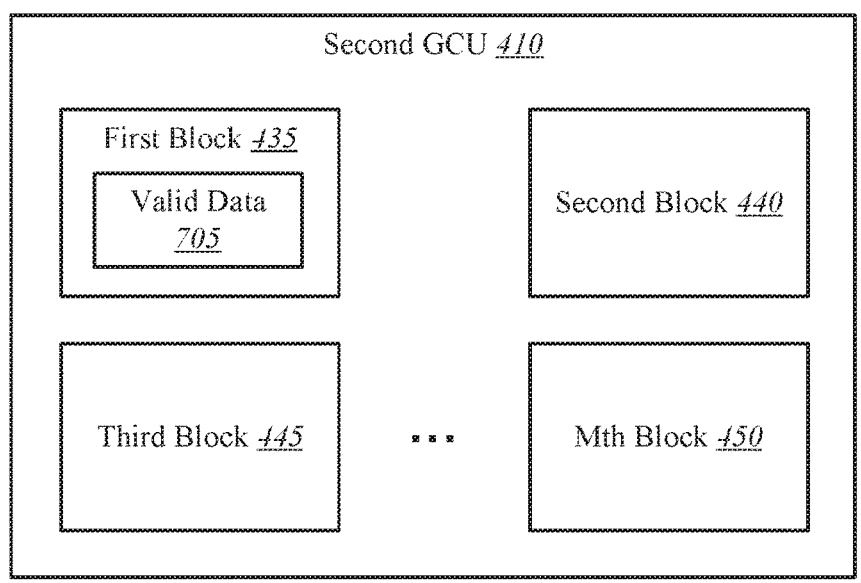

FIG. 7 shows an environment 700 for improving data refresh in flash memory, in accordance with various examples. Environment 700 may be one example of environment 500 of FIG. 5 and/or environment 600 of FIG. 6. At least one aspect of environment 700 may be implemented in conjunction with device 105 of FIG. 1, apparatus 205 of FIG. 2, and/or garbage collection module 130 depicted in FIGS. 1, 2 and/or 3.

In some cases, second block 420 may be analyzed to determine the ratio of stale data to valid data in second block 420. If the amount of stale data in second block 420 satisfies a predetermined threshold, only the valid data in second block 420 may be copied to another block of another GCU. For example, valid data 705 from second block 420 of first GCU 405 may be copied from second block 420 to first block 435 of second GCU 410. In this embodiment, second block 420 may be removed from first GCU 405, leaving first GCU 405 with N-1 blocks instead of N blocks. Parity for first GCU 405 may have been computed previously when first GCU 405 included N blocks, including second block 420. Thus, with one less block in first GCU 405, parity for the first GCU 405 may be recomputed based on the N-1 blocks remaining in first GCU 405. In some embodiments, based on valid data 705 from second block 420 being copied to first block 435 of second GCU 410, parity for second GCU 410 may be recomputed based on second GCU 410 being updated when the valid data 705 from second block 420 of first GCU 405 is copied to first block 435 of second GCU 410.

Figure 8:
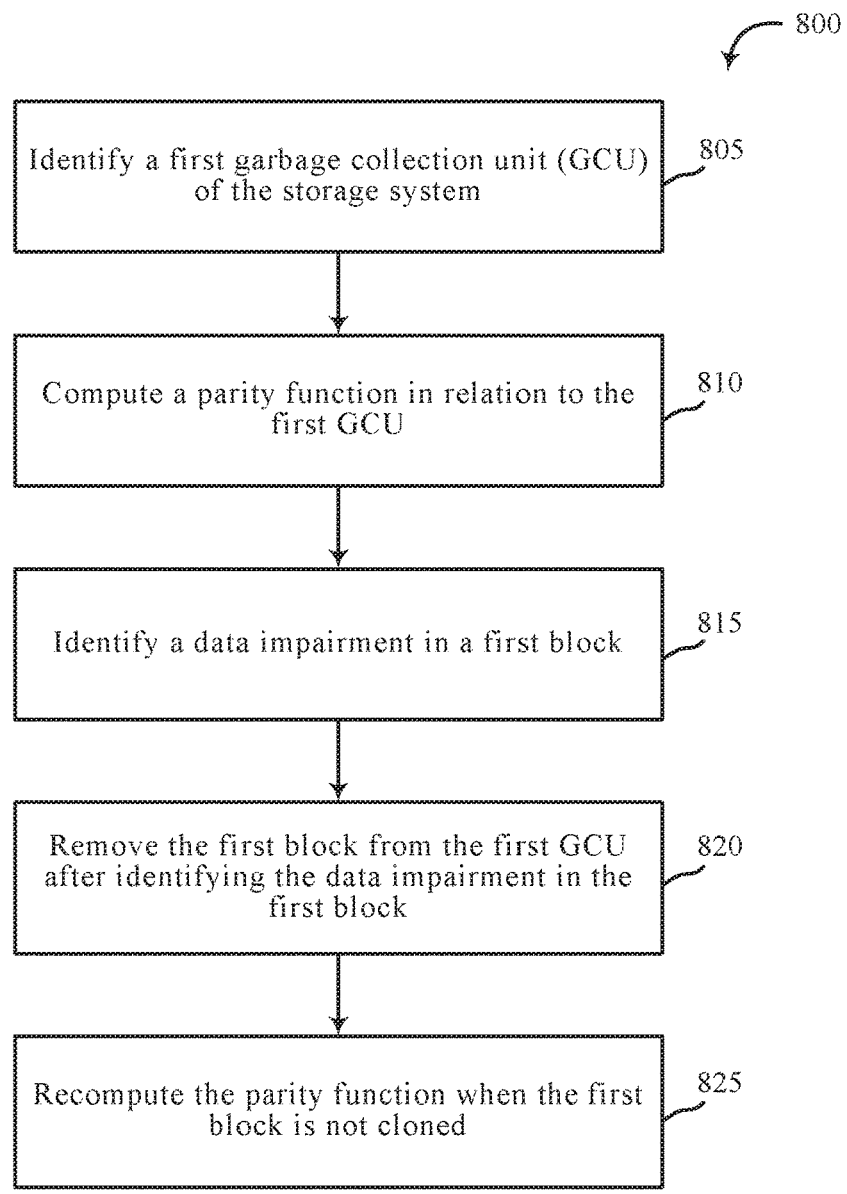
FIG. 8 is a flow chart illustrating an example of a method in accordance with various aspects of this disclosure.

FIG. 8 is a flow chart illustrating an example of a method 800 for improving data refresh in flash memory, in accordance with various aspects of the present disclosure. One or more aspects of the method 800 may be implemented in conjunction with device 105 of FIG. 1, apparatus 205 of FIG. 2, and/or garbage collection module 130 depicted in FIGS. 1, 2, and/or 3. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 805, the method 800 may include identifying a first garbage collection unit (GCU) of the storage system. In some cases, the first GCU may include N blocks from the multiple blocks. At block 810, the method 800 may include computing a parity function in relation to the first GCU. At block 815, the method 800 may include identifying a data impairment in a first block. In some cases, the first block may be any block from the N blocks in the first GCU. At block 820, after identifying the data impairment in the first block, the method 800 may include removing the first block from the first GCU. At block 825, the method 800 may include recomputing the parity function when the first block is not cloned. For example, when the first block is removed from the first GCU the contents of the first block may be cloned into a second block, creating an exact copy of the first block in the second block. The second block may be a block separate from the N blocks in the first GCU. This second block may replace the first block and in this case the parity computed at block 810 still applies to the first GCU. However, if the first block is removed and not replaced with a clone, then the parity may be recomputed based on the removal of the first block The operation(s) at block 805-825 may be performed using the garbage collection module 130 described with reference to FIGS. 1-3 and/or another module. Thus, the method 800 may provide for improving data refresh in flash memory relating to improving data refresh in flash memory. It should be noted that the method 800 is just one implementation and that the operations of the method 800 may be rearranged, omitted, and/or otherwise modified such that other implementations are possible and contemplated.

Figure 9:
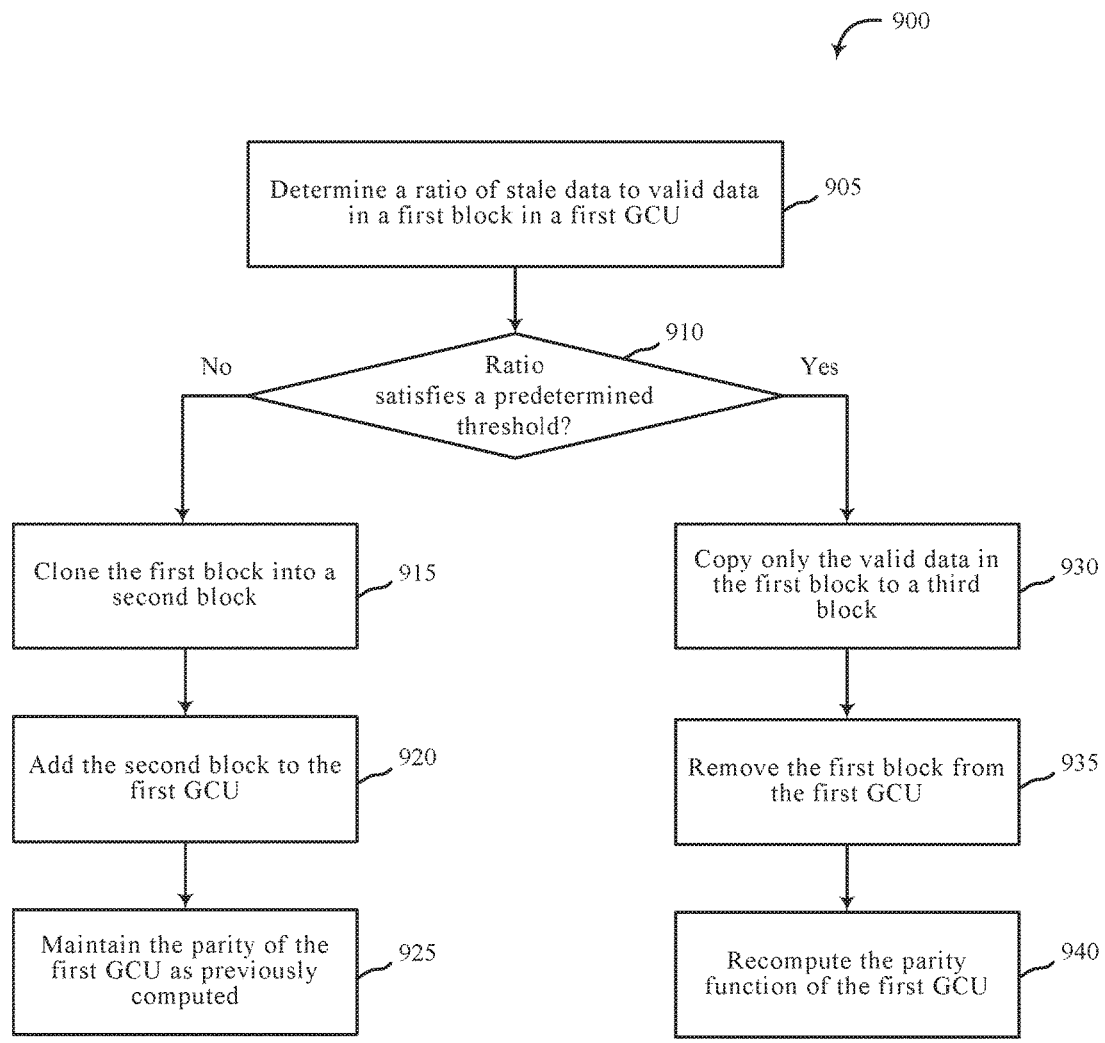
FIG. 9 is a flow chart illustrating an example of a method in accordance with various aspects of this disclosure.

FIG. 9 is a flow chart illustrating an example of a method 900 for improving data refresh in flash memory, in accordance with various aspects of the present disclosure. One or more aspects of the method 900 may be implemented in conjunction with device 105 of FIG. 1, apparatus 205 of FIG. 2, and/or garbage collection module 130 depicted in FIGS. 1, 2, and/or 3. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

As explained in relation to FIG. 8, parity may be computed for a set of N blocks in a first GCU (i.e., block 810 of method 800). Similarly, in some embodiments, the method 900 may include computing parity for a set of N blocks in a first GCU. At block 905, the method 900 may include determining a ratio of stale data to valid data in a first block in a first GCU. For example, the first block may contain 1 part stale data for each part of valid data (e.g., 50% stale and 50% valid). Similarly, in some cases, the first block may contain no stale data (e.g., 100% valid data). In some cases, the first block may contain a majority of stale data (e.g., 60% stale and 40% valid), or a minority of stale data (e.g., 25% stale and 75% valid), and so forth. At block 910, the method 900 may include determining whether a ratio of stale data to valid data in the first block satisfies a predetermined threshold. In some embodiments, the predetermined threshold may be satisfied when a majority of data is stale. In some cases, the predetermined threshold may be satisfied when an analysis of the time and computation cost of transferring both stale and valid data versus the time and computation cost of transferring only the valid data indicates copying only the valid data takes less time and/or has a lower computational cost.

If the ratio of stale data does not satisfy the predetermined threshold, at block 915, the method 900 may include cloning the first block into a second block. The second block may be a block separate from the N blocks in the first GCU. At block 920, the method 900 may include adding the second block to the first GCU. At block 925, after adding the second block to the first GCU, the method 900 may include maintaining the parity of the first GCU as previously computed based on the second block being a clone of the first block.

If the ratio of stale data does not satisfy the predetermined threshold, at block 930, the method 900 may include copying the valid data in the first block to a third block. The third block may be a block separate from the N blocks of the first GCU. At block 935, the method 900 may include removing the first block from the first GCU. Thus, the first block is not cloned into another block, but instead only the valid data is copied to the third block. After removing the first block from the first GCU, N-1 blocks remain in the first GCU. At block 940, the method 900 may include recomputing the parity function of the first GCU based on there being N-1 blocks remaining in the first GCU after removing the first block from the first GCU and not replacing it with a clone. In some embodiments, one or more operations of method 900 may be combined. For example, in one embodiment, while reading data (valid and stale data) the method 900 may recompute the parity function.

The operations at blocks 905-940 may be performed using the garbage collection module 130 described with reference to FIGS. 1-3 and/or another module. Thus, the method 900 may provide for improving data refresh in flash memory relating to improving data refresh in flash memory. It should be noted that the method 900 is just one implementation and that the operations of the method 900 may be rearranged, omitted, and/or otherwise modified such that other implementations are possible and contemplated.

In some examples, aspects from two or more of the methods 800 and 900 may be combined and/or separated. It should be noted that the methods 800 and 900 are just example implementations, and that the operations of the methods 800 and 900 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, e.g., a combination of a DSP and a microprocessor, multiple microprocessors, one or more microprocessors in conjunction with a DSP core, and/or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A storage system comprising:
    a solid state drive comprising multiple flash memory cells divided into multiple blocks, and a storage controller to:
        identify a first garbage collection unit (GCU) of the solid state drive, the first GCU including N blocks from the multiple blocks;
        compute a parity function of the first GCU;
        identify a data impairment in a first block, the first block being from the N blocks in the first GCU;
        after identifying the data impairment in the first block, copy content from the first block to a block outside the first GCU, clone the first block with the data impairment, and remove the first block from the first GCU;
        determine whether the clone of the first block is added to the first GCU;
        upon determining the clone of the first block is not added to the first GCU, recompute the parity function; and
        upon determining the clone of the first block is added to the first GCU, bypass recomputing the parity function for the first GCU.

2. The storage system of claim 1, the storage controller to: determine whether the first block includes stale data.

3. The storage system of claim 2, the storage controller to: clone the first block into a second block upon determining the first block does not include stale data.

4. The storage system of claim 3, the second block being an available block from the multiple blocks and separate from the N blocks in the first GCU.

5. The storage system of claim 3, the storage controller to: add the second block to the first GCU.

6. The storage system of claim 5, the storage controller to: after adding the second block to the first GCU, maintain the parity of the first GCU as is based on the second block being a clone of the first block, the parity of the first GCU including an XOR parity.

7. The storage system of claim 1, the storage controller to: erase the first block; and
    make the first block available to another GCU.

8. The storage system of claim 2, the storage controller to: determine a ratio of stale data to valid data in the first block upon determining the first block includes stale data.

9. The storage system of claim 8, the storage controller to: based on the ratio of stale data to valid data in the first block, remove the first block from the first GCU without cloning the first block; and
    copy the valid data in the first block to a third block, the third block being a block from a second GCU with M blocks from the multiple blocks.

10. The storage system of claim 9, the storage controller to:
    recompute the parity function of the first GCU based on there being N-1 blocks remaining in the first GCU after removing the first block from the first GCU without cloning the first block.

11. An apparatus comprising:
    a solid state storage drive configured for incorporation into a data center or data cloud environment, the solid state drive comprising multiple flash memory cells divided into multiple blocks; and a controller to:
  identify a first garbage collection unit (GCU) of the solid state drive, the first GCU including N blocks from the multiple blocks;
  compute a parity function of the first GCU;
  identify a data impairment in a first block, the first block being from the N blocks in the first GCU;
  after identifying the data impairment in the first block, copy content from the first block to a block outside the first GCU, clone the first block with the data impairment, and remove the first block from the first GCU;
  determine whether the clone of the first block is added to the first GCU;
  upon determining the clone of the first block is not added to the first GCU, recompute the parity function; and
  upon determining the clone of the first block is added to the first GCU, bypass recomputing the parity function for the first GCU.

12. The apparatus of claim 11, the controller to:
determine whether the first block includes stale data.

13. The apparatus of claim 12, the controller to:
clone the first block into a second block upon determining the first block does not include stale data.

14. The apparatus of claim 11, the second block being an available block from the multiple blocks and separate from the N blocks in the first GCU.

15. The apparatus of claim 13, the controller to:
add the second block to the first GCU.

16. The apparatus of claim 15, the controller to:
after adding the second block to the first GCU, maintain the parity of the first GCU as is based on the second block being a clone of the first block, the parity of the first GCU including an XOR parity.

17. The apparatus of claim 11, the controller to:
erase the first block; and
make the first block available to another GCU.

18. The apparatus of claim 12, the controller to:
determine a ratio of stale data to valid data in the first block upon determining the first block includes stale data.

19. A method of a storage system comprising:
  identifying a first garbage collection unit (GCU) of a solid state drive comprising multiple flash memory cells divided into multiple blocks, the first GCU including N blocks from the multiple blocks;
  computing a parity function of the first GCU;
  identifying a data impairment in a first block, the first block being from the N blocks in the first GCU;
  after identifying the data impairment in the first block, copying content from the first block to a block outside the first GCU, cloning the first block with the data impairment, and removing the first block from the first GCU;
  determining whether the clone of the first block is added to the first GCU;
  upon determining the clone of the first block is not added to the first GCU, recomputing the parity function; and
  upon determining the clone of the first block is added to the first GCU, bypassing recomputing the parity function for the first GCU.

20. The method of claim 19 comprising:
determine whether the first block includes stale data.

* * * * *